(12) United States Patent
Fackler

(10) Patent No.: US 6,418,507 B1
(45) Date of Patent: Jul. 9, 2002

(54) PROCESS FOR AUTOMATIC DOCUMENTATION OF THE OPERATION OF PROGRAMMING THE MEMORY OF A PROGRAMMABLE CONTROLLER

(75) Inventor: Rupert Fackler, Pleidelsheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/171,405
(22) PCT Filed: Feb. 27, 1997
(86) PCT No.: PCT/DE97/00343
  § 371 (c)(1),
  (2), (4) Date: Oct. 16, 1998
(87) PCT Pub. No.: WO97/39391
  PCT Pub. Date: Oct. 23, 1997

(30) Foreign Application Priority Data

Apr. 17, 1996 (DE) .......................................... 196 15 105

(51) Int. Cl.⁷ .............................................. G06F 12/00
(52) U.S. Cl. ...................... 711/103; 711/100; 711/160
(58) Field of Search ................................ 711/103, 161, 711/162, 115, 100, 160

(56) References Cited

U.S. PATENT DOCUMENTS 5,590,306 A * 12/1996 Wantanabe et al. .......... 711/115
6,046,936 A * 4/2000 Tsujikawa et al. ........... 365/185

FOREIGN PATENT DOCUMENTS

DE 4332499 3/1995
EP 0664387 7/1995

OTHER PUBLICATIONS

"Object–Oriented Documentation Tool", IBM Technical Disclosure Bulletin, vol. 34, No. 1, Jun. 1991, pp. 50 to 51.

* cited by examiner

Primary Examiner—Tuan V. Thai
(74) Attorney, Agent, or Firm—Walter Ottesen

(57) ABSTRACT

A method and apparatus is described for operating a control apparatus (20) having a control unit (21) coupling to a first programmable memory unit (22) for storing data and programs for controlling the operation of the control apparatus and a non-volatile second memory unit (23). The described method is characterized in that data, which document the programming operation, are stored therein when the programmable memory unit is programmed.

12 Claims, 1 Drawing Sheet

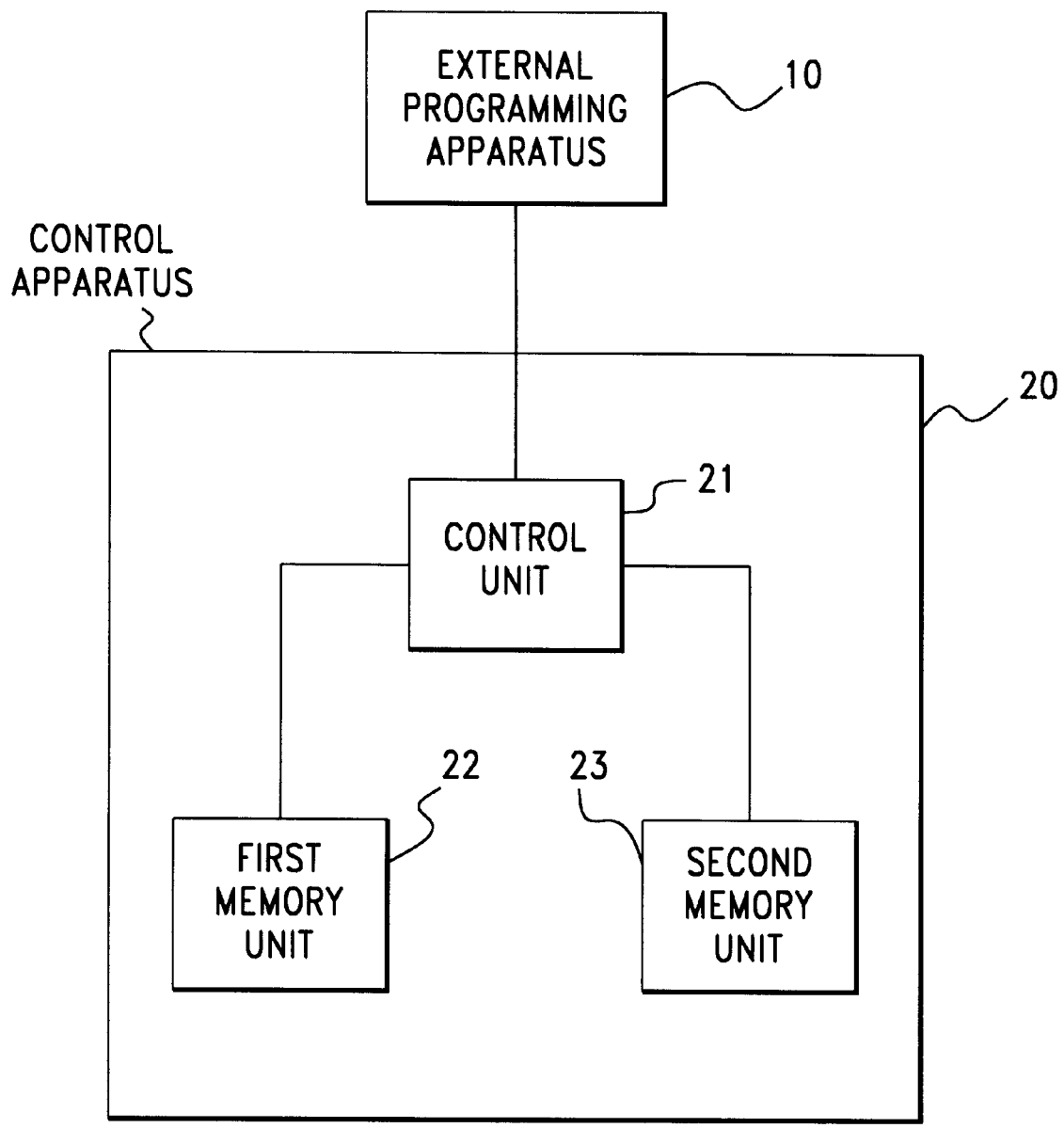

PROCESS FOR AUTOMATIC DOCUMENTATION OF THE OPERATION OF PROGRAMMING THE MEMORY OF A PROGRAMMABLE CONTROLLER

FIELD OF THE INVENTION

The invention relates to a method for operating a control apparatus having a programmable memory unit for storing data and programs for the operation of the control apparatus.

BACKGROUND OF THE INVENTION

A method of this kind is disclosed, for example, in DE 43 32 499 A1. The control apparatus, which is described in this publication, is a motor vehicle control apparatus which is equipped with programmable memory units in the form of flash EPROMs. More precisely, these memory units are erasable non-volatile memory units and store data and programs for the operation of the apparatus.

The provision of a programmable memory unit as a memory unit for storing data and programs for the operation of the control apparatus has proven to be advantageous because, in this way, the operation of the control apparatus can be permanently changed at any time in a simple manner and this is very significant especially for errors in the storage data and programs which errors were initially not recognized or for individual customer desires.

The use of flash EPROMs as programmable memory units has acquired increasing significance because they unite the advantages of a normal EPROM (high memory cell density in a tight space) and an EEPROM (electric and therefore simple and comfortable erasure of the memory content).

An external programming apparatus (for example, in the form of a personal computer) is connected to the control apparatus for initial programming, that is, erasure and/or overwriting of the flash EPROMs (preferably in dependence upon motor vehicle type in the motor vehicle manufacturing facility) or for a later reprogramming of the same (at the customer service facility for eliminating errors or according to individual customer desires). With a programming apparatus of this kind, the execution of control programs, which are stored in the control apparatus for erasing and/or overwriting of data in the flash EPROM is initiated and, if required, the data, which is newly stored, is made available.

A programmability of the memory unit of this kind which is simple and rapid to execute for storing data and programs for the operation of the control apparatus opens the possibility that the control apparatus is very flexible and, at the same time, can be adapted simply and rapidly to the particular situation.

On the other hand, a certain danger is associated with the possibility of overwriting or erasing the content of the memory unit because changes of the memory content can under circumstances lead to a considerable safety risk. This is especially so for changes which result because of disturbances or defective programming.

For this reason, it is, inter alia, necessary to eliminate as quickly as possible disturbances in the control apparatus and/or program apparatus. The search for the cause of a supposed disturbance is, however, only purposeful when it is certain that the change in the content of the memory is actually caused by a disturbance.

SUMMARY OF THE INVENTION

The present invention is therefore based on the object of seeking suitable measures which permit the determination of the cause for an improper content of the programmable memory unit.

According to the invention, the data documenting the programming operation are stored together with the programming of the programmable memory unit.

By correspondingly selecting the data, which document each programming operation, and storing the same in a non-volatile memory, more or less detailed statements can be made at any time from these data as to reprogramming of the programmable memory unit which has, possibly, been undertaken.

The more complete the data selected for documentation of the respective programming operations, the more precise can a later. reconstruction of the affected programming operation be effected.

The data, which are selected for documentation of each program operation, can, for example, contain information as to:

the time point, the sequence, the duration and/or the success of each programming operation;

the position (within the memory unit), the extent, the type (erasure and/or overwriting) and/or the content (for example, check sums of newly written data and the like) for each undertaken change; and/or the program apparatus which initiated the particular programming operation.

By evaluating information of this kind, it can be determined whether and to what extent particular regions of the programmable memory unit were subjected to data changes because of reprogramming operations.

The control apparatus and/or the programming apparatus suffer a disturbance which should be corrected when a data change, which is to be investigated, lies outside of ranges, which are changed by programming, or if the change is one which was not made by reprogramming.

In this way, it is possible to reliably determine the cause for an improper content of the programmable memory unit.

The determination of the cause is carried out in accordance with a fixed scheme which permits an automatic self test to be carried out for disturbances which are to be corrected, as needed.

Furthermore, and in addition to the reliable recognition of disturbances, the method of the invention makes it possible to determine whether, for an undertaken reprogramming of the programmable memory unit, a proper programming was performed by an authorized facility or a programming (inadvertent or deliberate misuse) was made by an unauthorized person.

Advantageous further embodiments of the invention are the subject matter of the dependent patent claims.

The invention is explained in greater detail in the following with reference to an embodiment while making reference to the drawing.

The FIGURE shows a control apparatus connected to an external programming apparatus which permits the method according to the invention to be carried out.

The explanation which follows relates to a method for operating a control apparatus and especially a control apparatus for controlling, for example, the engine, the transmission or the brakes, et cetera of a motor vehicle, that is, a motor vehicle control apparatus.

The control apparatus includes memory units, or more precisely erasable non-volatile memory units in the form of flash EPROMs having the special advantages for this area of application as already mentioned herein. These memory units are for storing data and programs for the operation of the control apparatus.

The programming of the memory units takes place via an external programming apparatus which can, for example, be connected to the motor vehicle control apparatus via a serial interface.

However, the present invention is not limited to the programming of flash EPROMs in motor vehicle control apparatus while using an external programming apparatus. The invention is rather everywhere applicable where a storage unit of a control apparatus is to be programmed via a programming arrangement.

BRIEF DESCRIPTION OF THE DRAWING

The control apparatus in the FIGURE is identified by reference numeral 20. The control apparatus includes a control unit 21, a first programmable memory unit 22, and a second programmable memory unit 23.

DESCRIPTION OF THE PREFERRED EMBODIMENTS OF THE INVENTION

The control unit 21 is realized by a microcomputer, a microcontroller, or the like. The control unit 21 runs programs for carrying out the control functions assigned thereto and for running itself. The programs are stored in the first memory unit 22 together with data, which might be necessary to carry out the programs.

The first memory unit 22 is a programmable memory unit or, more precisely, an erasable non-volatile memory unit in the form of a flash EPROM.

The second memory unit 23 is likewise a programmable memory unit or, more precisely, an erasable non-volatile memory unit which is realized, in the present embodiment, by an EEPROM. The second memory unit 23 functions to store programming documentation data which will be described in greater detail below.

The first memory unit 22 is programmed upon initiation and with the coaction of an external programming apparatus 10 which is preferably in the form of a personal computer or the like.

The programming apparatus 10 is connected to the control apparatus 20 via a series interface. If the program apparatus 10 issues a programming command to the control apparatus 20, the control apparatus initiates (at least insofar as it concerns a proper programming attempt) the erasure of data, which are stored in the first memory unit 22, and/or the writing-in of new data transmitted, as a rule, from the programming apparatus 10 into the first memory unit 22.

Together with the programming of the first memory unit 22 (that is, before, during and/or after the erasure and/or overwriting of the first memory unit 22) this operation is documented by storing the above-mentioned programming documentation data in the second memory unit 23. It is preferable to store the programming documentation data in the second memory unit 23 already or still during the programming of the first memory unit 22 because, with a time-dependent interlacing of this kind of storing data in the first and second memory units, the least possibilities are provided to undertake a reprogramming of the first memory unit 22 without documentation thereof via writing in documentation data into the second memory unit 23.

With an appropriate determination of the type and extent of the programming documentation data, more or less detailed statements as to the reprogramming undertaken of the first memory unit 22 can be made from this data at any time.

The more encompassing the programming documentation data are, the more precise can a later reconstruction of the programming operation documented thereby be effected.

The programming documentation data, which are selected to document the particular program operations, can, inter alia, for example, include information as to:

the time point, the sequence, the duration and/or the success of particular programming operations;

the position (within the first memory unit), the extent, the nature (erasure and/or overwriting) and/or the content (for example, check sums of newly written-in data and the like) for each undertaken change; and/or the programming apparatus initiating the particular programming operation.

In the present embodiment, the following data are stored as programming documentation data in the second memory unit 23: the date, an identifier of the programming apparatus, relevant status information and/or fault information of the control apparatus and/or programming apparatus during the programming of the first programming unit 22 and the check sums of data newly written into the first memory unit 22.

For the data, which are storable in the form of programming documentation data, there is, however, no limitation to the above-mentioned data. Rather, the programming documentation data can represent any information which (of any type whatever) provide information as to programming which has taken place or reprogramming of the first memory unit 22.

The triggering of the storage of the above-mentioned program documentation data into the second memory unit 23 can basically occur via the programming apparatus 10 as well as by the control apparatus 20.

It is, however, possible that improper reprogramming of the first memory unit 22 or the reprogramming thereof can be masked by unauthorized third persons. For this reason, that variation is preferred wherein the storage of the programming documentation data into the second memory unit 23 takes place completely automatically without triggering by the programming apparatus 10 and automatically by the control apparatus 20. For the above-mentioned reason, it can also be advantageous when the erasure and/or overwriting of the second memory unit 22 and a triggering thereof by an external arrangement, such as a programming apparatus 10, is explicitly precluded so that content stored in the second memory unit 23 cannot easily be eliminated.

In the present embodiment, the second memory unit 23 is automatically opened by the control apparatus 20 at the start of the programming of the first memory unit 22 (for example, when receiving the programming command by the programming apparatus) and is closed at the end of the programming of the first memory unit 22.

The storage capacity of the second memory unit 23 is preferably dimensioned to be adequately large in order to be able to document a plurality of the programming operations, which affect the first memory unit, for example, ten programming operations.

Not the data, which are to be written into or are written into the first memory unit 22, but only data documenting the storage operation as such are to be stored in the second memory unit 23. For this reason, the data quantity, which is to be stored in the second memory unit 23, is relatively small so that, even by providing a memory capacity adequate for several programming operations, a relatively low memory capacity is sufficient. For this reason, a memory unit can be used which, like EEPROMs, has a relatively low memory cell density. It is understood that also flash EPROMs can be utilized for the second memory unit 23 as well as for the first memory unit 22. The first and second memory units can also be formed by a single flash EPROM. Then, however, because of the completely different drive (as already described), a somewhat higher control complexity has to be accepted.

To keep the control complexity small (especially the address administration for the drive of the second memory 23), either an address counter, which is provided for the second memory unit, is so configured that it automatically jumps back to the storage start (modulo-counter) without a continuous check when reaching the end of the storage, or the second memory unit is configured as a ring memory.

The content of the second memory unit 23 can, as required, be read out via the series interface via which the programming apparatus 10 is also connected to the control apparatus 20.

The information, which is read out of the second memory unit 23 or can be evaluated, as required, internally in the control apparatus, documents the last programming operations of the first programming unit 23.

Based on this information, a determination can be made as to how data, which originally were not present in the first memory unit 22, got there, or, more precisely, whether data originally not present in the first memory unit 22 got there via a reprogramming of the first memory unit 22 or in another manner, such as via a disturbance.

Furthermore, it can be determined under circumstances (for example, while evaluating a stored program apparatus identifier or the like), whether an undertaken reprogramming of the first memory unit 22 was done by an authorized facility or person or not.

The determinations which can be made from the programming documentation data stored in the second memory unit 23 are of great significance for several reasons.

On the one hand, a decision can be made quickly and without error as to whether the control apparatus has to be exchanged or repaired because of occurring disturbances.

On the other hand, an impermissible defective programming or reprogramming can be proved with respect to a user which can, under some circumstances, lead to the forfeiture of guarantee or liability claims.

Furthermore, a determination can be made from the traceability of the reprogramming of the first memory unit 22 as to whether a defect or early wear of the components of the motor vehicle, which is to be controlled by the control apparatus, or the like is based on a defect of the affected component or an improper driving via the control apparatus.

What is claimed is:

1. A method for operating a control apparatus having a programmable first memory unit for storing data and programs for the operation of said control apparatus and a nonvolatile second memory unit, the method comprising the steps of:

programming said first memory unit with the coaction of an external programming device and with said step of programming, storing the data documenting the programming operation of said first memory unit in said second memory unit; and, once the data documentation of said first memory unit has been entered into said second memory unit, continuously blocking access by said external programming device or any other external programming device to said second memory unit during the entire operation of said control apparatus to ensure that all of the following are prevented:
   (a) erasing said second memory unit;
   (b) writing into said second memory unit;
   (c) triggering said erasing of said second memory unit; and,
   (d) triggering said writing into said second memory unit; so that the memory content of said second memory unit as to the documentation of said programming operation is preserved during the entire operation of said control apparatus thereby facilitating the discovery of the origin of a possibly occurring error in said data and programs stored in said first memory unit because of subsequent access to said first memory unit by said programming apparatus or said any other programming apparatus.

2. The method of claim 1, wherein the storing of data documenting the programming operation is started and ended by automatic and exclusive triggering by said control apparatus.

3. The method of claim 1, wherein the storage of said data, which document said programming operation, takes place during the programming of said first memory unit.

4. The method of claim 1, wherein the storage of said data, which document said programming operation, takes place during the erasing or overwriting of said first memory unit.

5. The method of claim 1, wherein said second memory unit is configured as a ring memory and is for the data which document the programming operation.

6. The method of claim 5, wherein an address counter is assigned to said second memory unit for the data documenting the programming operation and is configured as a modulo counter.

7. An arrangement for operating a control apparatus having a programmable first memory unit for storing data and programs for the operation of said control apparatus and a nonvolatile second memory unit, the arrangement comprising:

said first memory unit being programmable with the coaction of an external programming device;

means for storing the data documenting the programming operation of said first memory unit in said second memory unit with said step of programming; and, means for continuously blocking access by said external programming device or any other external programming device to said second memory unit once the data documentation of said first memory unit has been entered into said second memory unit, and the blocking of said access being effective during the entire operation of said control apparatus to ensure that all of the following are prevented:
   (a) erasing said second memory unit;
   (b) writing into said second memory unit;
   (c) triggering said erasing of said second memory unit; and,
   (d) triggering said writing into said second memory unit; so that the memory content of said second memory unit as to the documentation of said programming operation is preserved during the entire operation of said control apparatus thereby facilitating the discovery of the origin of a possibly occurring error in said data and programs stored in said first memory unit because of subsequent access to said first memory unit by said programming apparatus or said any other programming apparatus.

8. The arrangement of claim 7, wherein the storing of data documenting the programming operating is started and ended by automatic and exclusive triggering by said-control apparatus.

9. The arrangement of claim 7, wherein the storage of said data, which document said programming operation, takes place during the programming of said first memory unit.

10. The arrangement of claim 7, wherein the storage of said data, which document said programming operation, takes place during the erasing or overwriting of said first memory unit.

11. The arrangement of claim 7, wherein said second memory unit is configured as a ring memory and is for the data which document the programming operation.

12. The arrangement of claim 11, wherein an address counter is assigned to said second memory unit for the data documenting the programming operation and is configured as a modulo counter.

* * * * *